US008677590B2

(12) United States Patent
Hudson et al.

(10) Patent No.: US 8,677,590 B2
(45) Date of Patent: Mar. 25, 2014

(54) PLASMA CONFINEMENT STRUCTURES IN PLASMA PROCESSING SYSTEMS AND METHODS THEREOF

(71) Applicants: Eric Hudson, Berkeley, CA (US); Andreas Fischer, Castro Valley, CA (US)

(72) Inventors: Eric Hudson, Berkeley, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/022,111

(22) Filed: Sep. 9, 2013

(65) Prior Publication Data

US 2014/0007413 A1    Jan. 9, 2014

Related U.S. Application Data

(62) Division of application No. 12/361,494, filed on Jan. 28, 2009, now Pat. No. 8,540,844.

(60) Provisional application No. 61/139,491, filed on Dec. 19, 2008.

(51) Int. Cl.
| | | |
|---|---|---|
| *C23F 1/00* | (2006.01) | |
| *H01L 21/306* | (2006.01) | |
| *C23C 16/50* | (2006.01) | |
| *C23C 16/509* | (2006.01) | |
| *B25B 27/14* | (2006.01) | |
| *C23C 16/06* | (2006.01) | |
| *C23C 16/22* | (2006.01) | |

(52) U.S. Cl.
USPC ............... 29/281.6; 118/723 E; 118/723 R; 118/719; 156/345.47; 156/345.3; 29/700; 29/281.1; 29/592

(58) Field of Classification Search
USPC ......... 156/345.43, 345.47; 118/723 E, 723 R, 118/719; 29/700, 281.1, 281.6, 592
See application file for complete search history.

(56) References Cited

U.S. PATENT DOCUMENTS 4,632,719 A * 12/1986 Chow et al. ............... 156/345.46
4,954,201 A *  9/1990 Latz et al. ................. 156/345.43
(Continued)

FOREIGN PATENT DOCUMENTS

| JP | 05-036808 A | 2/1993 |
| KR | 100368200 B1 | 1/2003 |
| KR | 10-2006-0039637 A | 5/2006 |

OTHER PUBLICATIONS

"International Search Report", PCT Application No. PCT/US2009/088189, Mailing Date: Jul. 2, 2010.

(Continued)

*Primary Examiner* — Rudy Zervigon
(74) *Attorney, Agent, or Firm* — Martine Penilla Group, LLP

(57) ABSTRACT

A method for manufacturing a plasma processing system is provided. The method includes providing a movable plasma-facing structure configured to surround a plasma that is generated during processing of a substrate. The method also includes disposing a movable electrically conductive structure outside of the movable plasma-facing structure, wherein both structures configured to be deployed and retracted as a single unit to facilitate handling of the substrate. The movable electrically conductive structure is radio frequency (RF) grounded during the plasma processing. During processing, the RF current from the plasma flows to the movable electrically conductive structure through the movable plasma-facing structure during the plasma processing. The method further includes coupling a set of conductive straps to the movable electrically conductive structure. The set of conductive straps accommodates the movable electrically conductive structure when it is deployed and retracted while providing the RF current a low impedance path to ground.

20 Claims, 3 Drawing Sheets

(56) References Cited

U.S. PATENT DOCUMENTS

| | | | |
|---|---|---|---|
| 5,006,192 A * | 4/1991 | Deguchi | 156/345.44 |
| 5,084,125 A * | 1/1992 | Aoi | 156/345.31 |
| 5,292,370 A * | 3/1994 | Tsai et al. | 118/723 MP |
| 5,534,751 A * | 7/1996 | Lenz et al. | 315/111.71 |
| 5,647,912 A * | 7/1997 | Kaminishizono et al. | 118/719 |
| 5,660,673 A | 8/1997 | Miyoshi | |
| 5,879,523 A * | 3/1999 | Wang et al. | 204/298.11 |
| 5,891,350 A * | 4/1999 | Shan et al. | 216/71 |
| 5,897,752 A * | 4/1999 | Hong et al. | 204/192.12 |
| 5,900,103 A * | 5/1999 | Tomoyasu et al. | 156/345.44 |
| 5,919,332 A | 7/1999 | Koshiishi et al. | |
| 5,998,932 A * | 12/1999 | Lenz | 315/111.21 |
| 6,008,130 A * | 12/1999 | Henderson et al. | 438/710 |
| 6,019,060 A * | 2/2000 | Lenz | 118/723 R |
| 6,022,461 A * | 2/2000 | Kobayashi et al. | 204/298.07 |
| 6,178,919 B1 * | 1/2001 | Li et al. | 118/723 E |
| 6,221,221 B1 * | 4/2001 | Al-Shaikh et al. | 204/298.02 |
| 6,245,192 B1 * | 6/2001 | Dhindsa et al. | 156/345.34 |
| 6,296,747 B1 * | 10/2001 | Tanaka | 204/298.07 |
| 6,350,317 B1 * | 2/2002 | Hao et al. | 118/71 |
| 6,362,110 B1 * | 3/2002 | Marks | 438/711 |
| 6,383,931 B1 * | 5/2002 | Flanner et al. | 438/689 |
| 6,407,367 B1 * | 6/2002 | Ito et al. | 219/390 |
| 6,433,484 B1 * | 8/2002 | Hao et al. | 315/111.21 |
| 6,444,085 B1 | 9/2002 | Collins et al. | |
| 6,492,774 B1 * | 12/2002 | Han et al. | 315/111.21 |
| 6,506,685 B2 * | 1/2003 | Li et al. | 438/710 |
| 6,527,911 B1 * | 3/2003 | Yen et al. | 156/345.43 |
| 6,602,381 B1 * | 8/2003 | Lenz | 156/345.1 |
| 6,627,050 B2 * | 9/2003 | Miller et al. | 204/192.22 |
| 6,645,357 B2 * | 11/2003 | Powell | 204/298.11 |
| 6,652,713 B2 * | 11/2003 | Brown et al. | 156/345.51 |
| 6,653,734 B2 * | 11/2003 | Flanner et al. | 257/758 |
| 6,669,811 B2 * | 12/2003 | Hao et al. | 156/345.3 |
| 6,706,138 B2 * | 3/2004 | Barnes et al. | 156/345.1 |
| 6,716,762 B1 * | 4/2004 | Lenz | 438/710 |
| 6,726,805 B2 * | 4/2004 | Sherstinsky et al. | 156/345.5 |
| 6,730,174 B2 * | 5/2004 | Liu et al. | 118/715 |
| 6,744,212 B2 * | 6/2004 | Fischer et al. | 315/111.21 |
| 6,770,166 B1 * | 8/2004 | Fischer | 156/345.47 |
| 6,823,815 B2 * | 11/2004 | Han et al. | 118/723 E |
| 6,837,968 B2 * | 1/2005 | Brown et al. | 156/345.51 |
| 6,841,943 B2 * | 1/2005 | Vahedi et al. | 315/111.71 |
| 6,863,784 B2 * | 3/2005 | Hao et al. | 204/192.1 |
| 6,872,281 B1 * | 3/2005 | Chen et al. | 156/345.43 |
| 6,887,340 B2 * | 5/2005 | Dhindsa et al. | 156/345.3 |
| 6,887,341 B2 * | 5/2005 | Strang et al. | 156/345.48 |
| 6,910,441 B2 * | 6/2005 | Jang | 118/723 R |
| 6,974,523 B2 * | 12/2005 | Benzing et al. | 156/345.47 |
| 6,984,288 B2 * | 1/2006 | Dhindsa et al. | 156/345.47 |
| 6,991,701 B2 * | 1/2006 | Takenaka et al. | 156/345.51 |
| 7,001,491 B2 * | 2/2006 | Lombardi et al. | 204/192.12 |
| 7,009,281 B2 * | 3/2006 | Bailey et al. | 257/642 |
| 7,094,315 B2 * | 8/2006 | Chen et al. | 156/345.47 |
| 7,169,256 B2 * | 1/2007 | Dhindsa et al. | 156/345.47 |
| 7,244,311 B2 * | 7/2007 | Fischer | 118/725 |
| 7,252,737 B2 * | 8/2007 | Brown et al. | 156/345.51 |
| 7,318,879 B2 * | 1/2008 | Kwon et al. | 156/345.47 |
| 7,390,366 B2 * | 6/2008 | Shim | 118/715 |
| 7,405,521 B2 * | 7/2008 | Dhindsa et al. | 315/111.21 |
| 7,429,306 B2 * | 9/2008 | Ma | 156/345.26 |
| 7,430,986 B2 * | 10/2008 | Dhindsa et al. | 118/723 E |
| 7,438,018 B2 * | 10/2008 | Son | 118/723 R |
| 7,455,748 B2 * | 11/2008 | Keil et al. | 156/345.46 |
| 7,470,627 B2 * | 12/2008 | Han et al. | 438/710 |
| 7,482,550 B2 * | 1/2009 | Larson et al. | 219/121.43 |
| 7,569,125 B2 * | 8/2009 | Gung et al. | 204/298.11 |
| 7,578,258 B2 * | 8/2009 | Fischer | 118/723 R |
| 7,632,375 B2 * | 12/2009 | Kuthi et al. | 156/345.1 |
| 7,632,377 B2 * | 12/2009 | Lai | 156/345.24 |
| 7,686,928 B2 * | 3/2010 | Gung | 204/298.2 |
| 7,713,379 B2 * | 5/2010 | Rogers | 156/345.43 |
| 7,740,736 B2 * | 6/2010 | Fischer et al. | 156/345.43 |
| 7,749,326 B2 * | 7/2010 | Kim et al. | 118/715 |
| 7,804,040 B2 * | 9/2010 | Brown et al. | 219/121.43 |
| 7,837,825 B2 * | 11/2010 | Fischer | 156/345.47 |
| 7,838,086 B2 * | 11/2010 | Keil et al. | 427/571 |
| 7,875,824 B2 * | 1/2011 | Larson et al. | 219/121.43 |
| 7,879,184 B2 * | 2/2011 | Hudson et al. | 156/345.38 |
| 7,939,778 B2 * | 5/2011 | Larson et al. | 219/121.43 |
| 7,976,673 B2 * | 7/2011 | Loewenhardt et al. | 156/345.47 |
| 8,012,306 B2 * | 9/2011 | Dhindsa | 156/345.47 |
| 8,026,159 B2 * | 9/2011 | Horii et al. | 438/500 |
| 8,043,430 B2 * | 10/2011 | Dhindsa et al. | 118/715 |
| 8,069,817 B2 * | 12/2011 | Fischer et al. | 118/723 E |
| 8,080,168 B2 * | 12/2011 | Cirigliano | 216/59 |
| 8,084,705 B2 * | 12/2011 | Larson et al. | 219/121.43 |
| 8,161,906 B2 * | 4/2012 | Kadkhodayan et al. | 118/723 E |
| RE43,508 E * | 7/2012 | Lenz | 156/345.43 |
| 8,221,582 B2 * | 7/2012 | Patrick et al. | 156/345.34 |
| 8,252,116 B2 * | 8/2012 | Sneh | 118/715 |
| 8,262,798 B2 * | 9/2012 | Yamada et al. | 118/724 |
| 8,262,922 B2 * | 9/2012 | Dhindsa et al. | 216/67 |
| 8,272,346 B2 * | 9/2012 | Bettencourt et al. | 118/723 E |
| 8,277,561 B2 * | 10/2012 | Kim et al. | 118/715 |
| 8,290,717 B2 * | 10/2012 | Dhindsa et al. | 702/22 |
| 8,298,338 B2 * | 10/2012 | Kim et al. | 118/715 |
| 8,313,805 B2 * | 11/2012 | Kadkhodayan et al. | 427/248.1 |
| 8,337,623 B2 * | 12/2012 | Dhindsa | 134/1.1 |
| 8,337,662 B2 * | 12/2012 | Rogers | 156/345.43 |
| 8,465,620 B2 * | 6/2013 | Benzing et al. | 156/345.47 |
| 8,522,716 B2 * | 9/2013 | Kadkhodayan et al. | 118/723 I |
| 8,540,844 B2 | 9/2013 | Hudson et al. | |
| 2001/0042511 A1 | 11/2001 | Liu et al. | |
| 2003/0029564 A1 * | 2/2003 | Brown et al. | 156/345.1 |
| 2003/0029567 A1 * | 2/2003 | Dhindsa et al. | 156/345.47 |
| 2003/0084849 A1 * | 5/2003 | Shim | 118/715 |
| 2003/0151371 A1 * | 8/2003 | Fischer et al. | 315/111.21 |
| 2004/0000875 A1 * | 1/2004 | Vahedi et al. | 315/111.71 |
| 2004/0035532 A1 | 2/2004 | Jung | |
| 2004/0083977 A1 * | 5/2004 | Brown et al. | 118/728 |
| 2004/0134427 A1 * | 7/2004 | Derderian et al. | 118/715 |
| 2004/0262155 A1 * | 12/2004 | Lombardi et al. | 204/298.01 |
| 2005/0039682 A1 * | 2/2005 | Dhindsa et al. | 118/723 E |
| 2005/0056370 A1 * | 3/2005 | Brown et al. | 156/345.51 |
| 2005/0070105 A1 * | 3/2005 | Bailey et al. | 438/689 |
| 2005/0103442 A1 | 5/2005 | Chen et al. | |
| 2005/0173239 A1 * | 8/2005 | Somekh et al. | 204/192.13 |
| 2006/0051967 A1 * | 3/2006 | Chang et al. | 438/710 |
| 2006/0102283 A1 * | 5/2006 | Kwon et al. | 156/345.24 |
| 2006/0278340 A1 * | 12/2006 | Fischer | 156/345.47 |
| 2007/0068900 A1 | 3/2007 | Kim et al. | |
| 2007/0204797 A1 * | 9/2007 | Fischer | 118/723 R |
| 2008/0187682 A1 | 8/2008 | Park et al. | |
| 2008/0241420 A1 * | 10/2008 | Dhindsa et al. | 427/569 |
| 2008/0268172 A1 | 10/2008 | Fukuda et al. | |
| 2008/0271849 A1 * | 11/2008 | Benzing et al. | 156/345.44 |
| 2009/0061648 A1 * | 3/2009 | Horii et al. | 438/778 |
| 2009/0165713 A1 * | 7/2009 | Kim et al. | 118/719 |
| 2009/0173389 A1 * | 7/2009 | Fischer | 137/2 |
| 2009/0200269 A1 * | 8/2009 | Kadkhodayan et al. | 216/71 |
| 2009/0260569 A1 * | 10/2009 | Kim et al. | 118/715 |
| 2009/0272718 A1 * | 11/2009 | Fischer | 216/37 |
| 2009/0280040 A1 * | 11/2009 | Park et al. | 422/186.05 |
| 2009/0288604 A1 * | 11/2009 | Kim et al. | 118/726 |
| 2010/0154709 A1 * | 6/2010 | Fischer et al. | 118/723 I |
| 2010/0154996 A1 * | 6/2010 | Hudson et al. | 156/345.35 |
| 2011/0042009 A1 * | 2/2011 | Lee et al. | 156/345.43 |
| 2012/0279659 A1 * | 11/2012 | Dhindsa | 156/345.44 |

OTHER PUBLICATIONS

"Written Opinion", PCT Application No. PCT/US2009/068189, Mailing Date: Jul. 2, 2010.

"International Search Report", PCT Application No. PCT/US2009/068195, Mailing Date: Aug. 13, 2010.

"Written Opinion", PCT Application No. PCT/US2009/068195, Mailing Date: Aug. 13, 2010.

"International Preliminary Report on Patentability", PCT Application No. PCT/US2009/068195, Mailing Date: Jun. 30, 2011.

"International Preliminary Report on Patentability", PCT Application No. PCT/US2009/068189, Mailing Date: Jun. 30, 2011.

(56) References Cited

OTHER PUBLICATIONS

"Non Final Office Action", U.S. Appl. No. 12/361,490, filed Apr. 26, 2012.
"Final Office Action", U.S. Appl. No. 12/361,490, filed Sep. 11, 2012.
"Non Final Office Action", U.S. Appl. No. 12/361,490, filed Nov. 29, 2012.
"Non Final Office Action", U.S. Appl. No. 12/361,494, Mailing Date: Nov. 23, 2012.
"Final Office Action", U.S. Appl. No. 12/361,490, filed May 2, 2013.

* cited by examiner

PLASMA CONFINEMENT STRUCTURES IN PLASMA PROCESSING SYSTEMS AND METHODS THEREOF

PRIORITY CLAIM

This application is a divisional and claims priority under 35 U.S.C. §120 to a previously filed patent application entitled "PLASMA CONFINEMENT STRUCTURES IN PLASMA PROCESSING SYSTEMS", by Hudson et al., application Ser. No. 12/361,494 filed on Jan. 28, 2009, which is related to and claims priority under 35 U.S.C. §119(e) to a commonly assigned provisional patent application entitled "Plasma Confinement Structures In Plasma Processing Systems," by Hudson et al., application Ser. No. 61/139,491 filed on Dec. 19, 2008, all of which are incorporated herein by reference.

BACKGROUND OF THE INVENTION

Plasma processing systems have long been employed to process substrates (e.g., wafers) in plasma processing systems. In a typical plasma processing chamber, plasma is ignited and confined in a plasma confinement region, which is typically defined by the chamber upper and lower structures, as well as by structures that annularly surround the plasma confinement region.

To facilitate the insertion and removal of substrates, as well as to facilitate the evacuation of exhaust gas from the plasma processing chamber, many chambers employ a set of movable confinement rings to annularly confine the plasma. The movable confinement rings can be lifted upward, for example, to facilitate substrate insertion and removal. Generally speaking, the spacing between adjacent rings of the movable confinement rings is dimensioned to permit exhaust gas to be evacuated through the spacing while presenting a barrier to plasma expansion (e.g., by making the spacing smaller than the plasma sheath). In this manner, it is possible to physically constrain the plasma while allowing exhaust gas removal to occur through the set of movable confinement rings.

To facilitate discussion, FIG. 1 shows a simplified diagram of a portion of a prior art capacitively-coupled plasma processing chamber 100. There is shown a lower electrode 102 for supporting a substrate (not shown) during processing. Lower electrode 102 is typically powered by an RF power source (not shown) to generate and sustain a plasma 104. For process control purposes, it is desirable to confine plasma 104 within a plasma confinement region defined generally by lower electrode 102, upper electrode 106 (which may be grounded or powered by the same or another RF power source), and annularly by a set of confinement rings 110 (including rings 110a-d). As mentioned, gaps between confinement rings 110 allow exhaust gas to be pumped from the chamber while keeping the plasma confined within the aforementioned plasma confinement region. Confinement rings 110 may be made of a suitable material, such as quartz.

In the example of FIG. 1, there is also shown an annular grounded electrode 112 surrounding lower electrode 102. Annular grounded electrode 112 may be slotted to provide additional flow channels for evacuating exhaust gas from the chamber. Generally speaking, annular grounded electrode 112 is formed of a conductive material such as aluminum, and is electrically isolated from lower electrode 102 by an insulator (not shown). Grounding of grounded electrode 112 is accomplished by coupling grounded electrode 112 to an RF ground, typically via one or more straps to a conductive lower ground extension that is disposed below lower electrode 112.

To prevent the metallic material of annular grounded electrode 112 from being exposed to the corrosive plasma and possibly contaminating the plasma process, the surface of annular grounded electrode 112 may be covered with a suitable material, such as quartz. As in the case with the set of confinement rings 110, the slots in annular grounded electrode 112 (and the overlying layer of quartz) are dimensioned to permit exhaust gas evacuation while preventing plasma from expanding beyond the plasma confinement region. The use of both confinement rings 110 and annular grounded electrode 112 in plasma processing chambers is known and will not be elaborated further here.

Generally speaking, confinement rings 110 are electrically floating, i.e., having no direct coupling to DC ground or RF ground. Since confinement rings 110 tend to be some distant away from RF ground in the prior art, no appreciable RF current flows through the set of confinement rings.

Since confinement rings 110 are left electrically floating and no appreciable RF current flows through confinement rings 110, a low voltage "floating" sheath is developed at the surface of confinement rings 110 during plasma processing. Since the energy of ions accelerated from the plasma is governed by the sheath potential, a low sheath potential results in a low energy level of ion bombardment on the surfaces of the confinement rings. Consequently, film removal processes such as sputtering and ion-enhanced etching (such as those occurring during in-situ plasma clean processes) are relatively inefficient at the surface of the confinement rings. Furthermore, a higher quantity of deposition is left on the surface of the confinement rings after processing due to the low ion bombardment energy. By comparison, other regions of the chamber experiencing higher ion bombardment energy will see a higher film removal rate during film removal processes and a lower level of film deposition during substrate processing.

The net result is that the confinement rings tend to accumulate residues at a higher rate (relative to chamber regions that experience a higher ion bombardment energy) during substrate processing, and these residues tend to be removed more slowly (relative to chamber regions that experience a higher ion bombardment energy) during plasma in-situ chamber clean processes. These factors necessitate more frequent and/or longer in-situ chamber clean cycles (such as waferless auto-clean or WAC cycles) to keep the confinement rings in a satisfactory condition and may even require, in some cases, halting processing altogether so that the confinement rings can be removed and cleaned and/or replaced. As a consequence, the substrate throughput rate is disadvantageously reduced, leading to lower productivity and a higher cost of ownership for the plasma processing tool.

SUMMARY OF INVENTION

The invention relates, in an embodiment, to a movable plasma confinement structure configured for confining plasma in a plasma processing chamber during plasma processing of a substrate. The movable plasma confinement structure includes a movable plasma-facing structure configured to surround the plasma. The movable plasma confinement structure also includes a movable electrically conductive structure disposed outside of the movable plasma-facing structure and configured to be deployed and retracted with the movable plasma-facing structure as a single unit to facilitate handling of the substrate. The movable electrically conductive structure is radio frequency (RF) grounded during the plasma processing. The movable plasma-facing structure is disposed between the plasma and the movable electrically conductive structure during the plasma processing such that RF current from the plasma flows to the movable electrically conductive structure through the movable plasma-facing structure during the plasma processing.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF VARIOUS EMBODIMENTS

Figure 1:
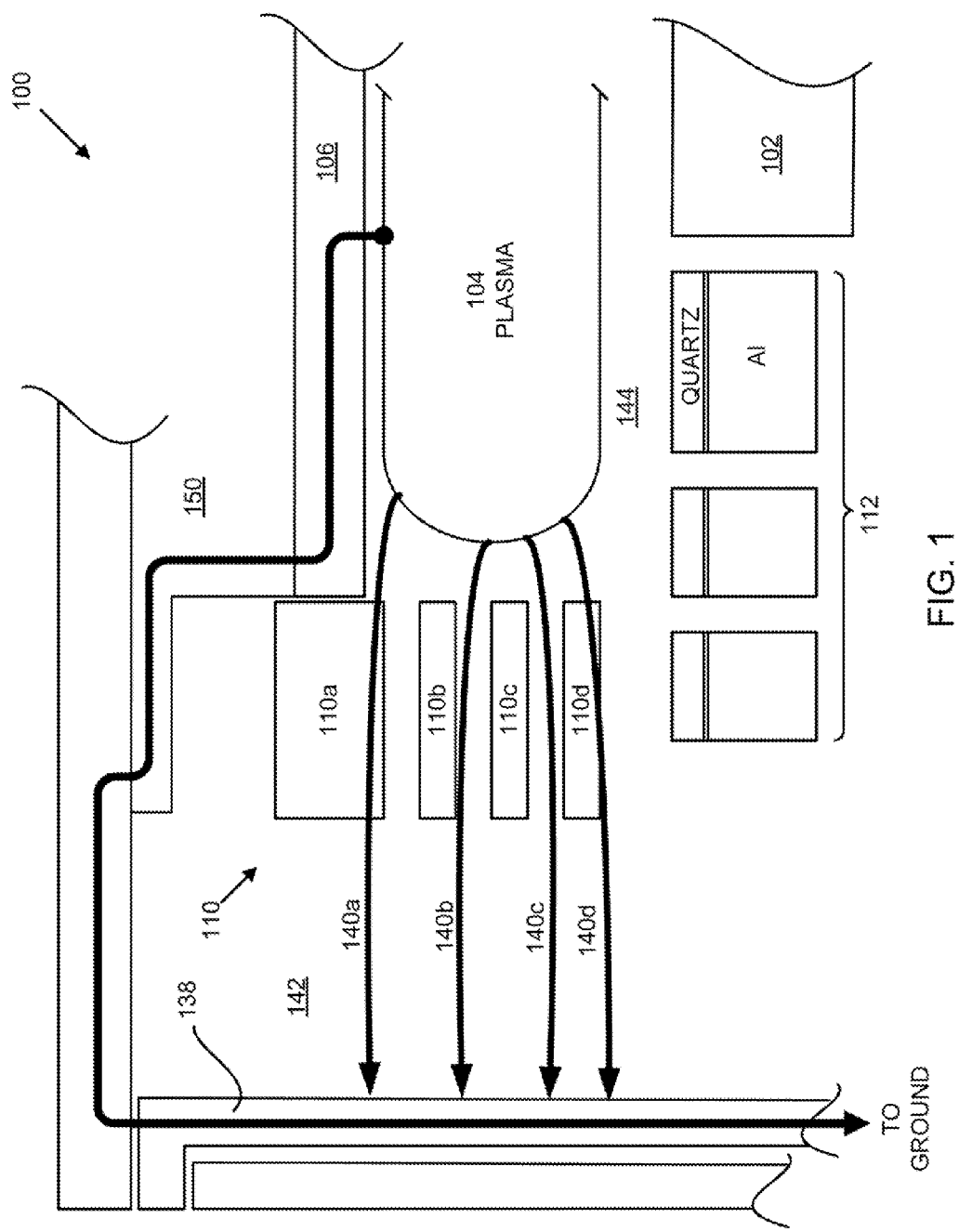
FIG. 1 shows a simplified diagram of a portion of a prior art capacitively-coupled plasma processing chamber.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The inventors herein have noted that when a component is electrically floating, i.e., uncoupled to a DC or an RF ground, the plasma sheath voltage developed at its surface is relatively low in potential. Such is the case with prior an confinement rings, e.g., confinement rings 110 of FIG. 1. In contrast, although there exists a thin layer of quartz on top of annular grounded electrode 112 of FIG. 1, the inventors have noted that residue accumulates at a slower rate on the surface of annular grounded electrode 112 compared to the accumulation rate on the surface of confinement rings 110. It is believe that although the quartz layer acts as a DC insulator, the fact that the quartz layer is relatively thin renders it possible for the RF current to flow to ground through the relatively low impedance path through the thin quartz layer, thereby resulting in a higher plasma sheath voltage and concomitantly a higher level of ion bombardment.

From this understanding, the following embodiments of the invention are herein disclosed. Generally speaking, one or more embodiments of the invention relate to improved methods and arrangements for processing substrates in a plasma processing chamber while reducing residue accumulation on the confinement rings and/or structures that face the plasma. In one or more embodiments, the improvement also helps keep the plasma confined in the plasma confinement region, i.e., reducing the possibility of a plasma unconfinement event occurring in the annular outer region outside of the aforementioned plasma confinement region.

In one or more embodiments of the invention, a movable RF-grounded plasma confinement assembly (movable RFG plasma confinement assembly) is provided. The movable RFG plasma confinement assembly includes at least a movable plasma confinement structure that is both DC insulated and well-coupled to RF ground. In an embodiment, the movable plasma confinement structure includes a movable plasma-facing structure (which may be formed of quartz or another similarly suitable material) and a movable electrically conductive structure coupled to the back of the movable plasma-facing structure to provide a RF current path to ground. That is, one side of the movable plasma-facing structure faces the plasma, and the other side is coupled to the movable electrically conductive structure, which is shielded from the plasma by the movable plasma-facing structure.

In practice, a small gap may be provided (about 0.01 inch, in an example) between the movable plasma-facing structure and the movable electrically conductive structure to accommodate thermal expansion. Grooves, shoulders, fasteners, spacers, and other known mechanical coupling techniques, the details of which are not germane to the present invention, may be employed to achieve the coupling of the movable plasma-facing structure with the movable electrically conductive structure while leaving the aforementioned thermal expansion gap in between.

The movable plasma confinement structure that comprises the movable plasma-facing structure and the attached electrically conductive structure moves up and down as a single unit during substrate insertion and removal. In an embodiment, the plasma-facing confinement structure represents a cylindrical-shaped quartz inner sleeve, and the electrically conductive structure represents a cylindrical-shaped anodized aluminum outer sleeve that is disposed outside of and coupled to the cylindrical-shaped quartz inner sleeve.

Although the above example discusses an insulating plasma-facing structure, the plasma facing structure is not limited to being insulative. Generally speaking, any plasma resistant and process compatible structure may be employed as long as the movable plasma confinement structure as a whole allows the RF current from the plasma to traverse in the manner discussed earlier and facilitates the generation of a high plasma sheath voltage to, for example, improve ion bombardment.

In one or more embodiments, the movable plasma confinement structure includes a movable plasma-facing structure formed of a material that is conductive and process-compatible (which may by formed of doped SiC or another processing compatible material) and a movable electrically conductive support structure coupled to the movable plasma-facing structure to provide a RF current path to ground. In an embodiment, the plasma-facing structure represents a doped-SiC cylinder and the electrically conductive structure represents a ring-shaped anodized aluminum mount that is coupled to the doped-SiC cylinder. In an embodiment, the plasma-facing structure is disposed above and coupled to the electrically conductive structure.

The movable RFG plasma confinement assembly further includes one or more flexible conductive straps coupled to the movable electrically conductive structure to provide the RF current a low impedance path to RF ground, which is typically the chamber wall or another electrically conductive structure that is coupled to RF ground. In an embodiment, one or more additional RF contacts may optionally be provided to shorten the RF current path to ground when the movable plasma confinement structure is in a deployed position during substrate processing. As will be explained later herein, the shortening of the RF current path when the plasma is present helps reduce the capacitive coupling and the inductive coupling in the annular outer region outside of the plasma confinement region, thereby reducing the possibility of inadvertently igniting and/or sustaining unconfined plasma in this annular outer region.

The features and advantages of embodiments of the invention may be better understood with reference to the figures and discussions that follow.

Figure 2:
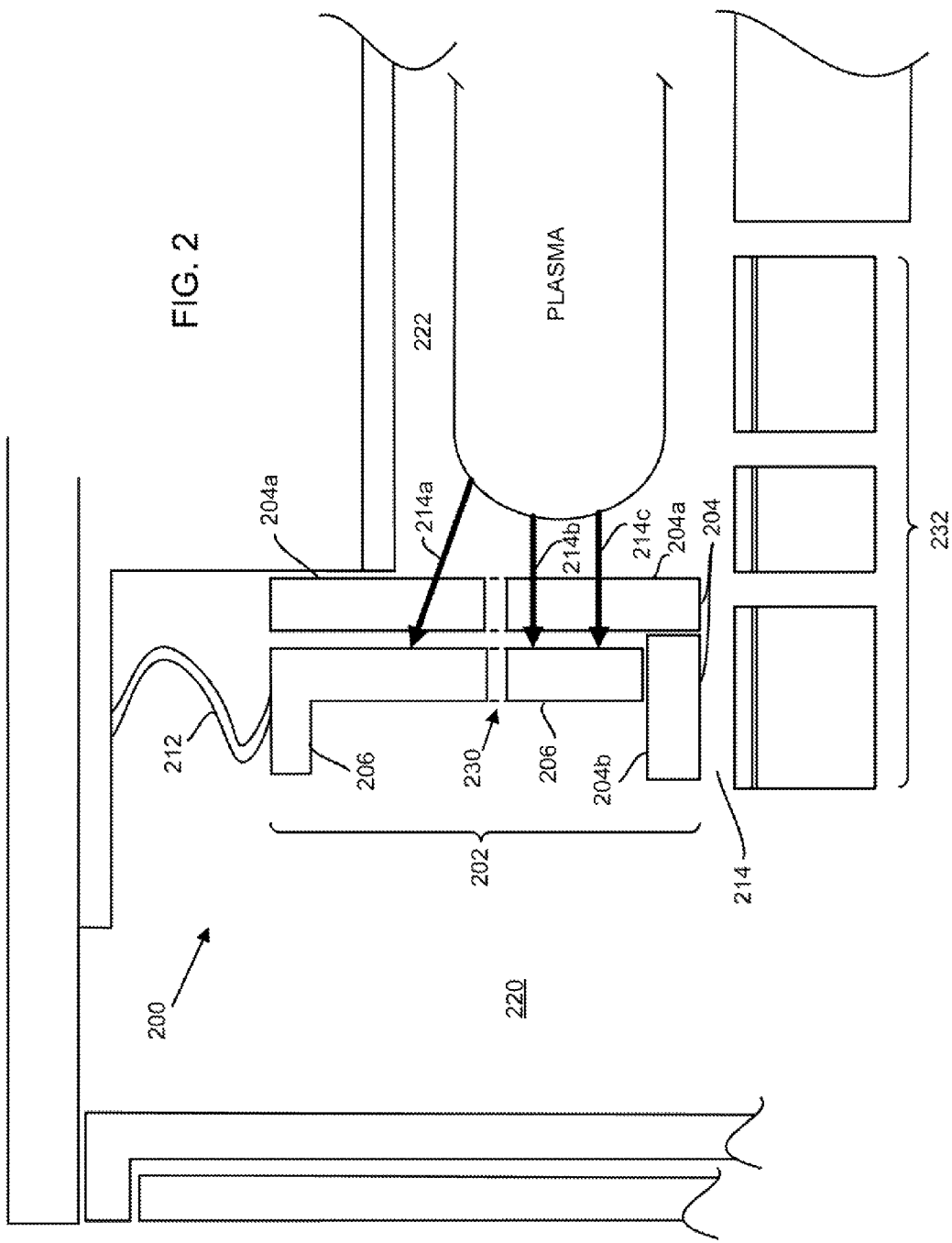
FIG. 2 shows, in accordance with an embodiment of the present invention, a simplified portion of a plasma processing chamber including the movable RF-grounded plasma confinement assembly.

FIG. 2 shows, in accordance with an embodiment of the present invention, a simplified portion of a plasma processing chamber including a movable RFG plasma confinement assembly 200. Movable RFG plasma confinement assembly 200 includes a movable plasma confinement structure 202 that includes a movable plasma-facing structure 204 and a movable electrically conductive structure 206. In the example of FIG. 2, movable plasma-facing structure 204 is implemented by a cylindrical-shaped quartz sleeve 204a and a horizontal quartz ring 204b, although any other suitable material that is compatible with the plasma process may be employed. Cylindrical-shaped quartz sleeve 204a faces the plasma during processing, while horizontal quartz ring 204b protects movable electrically conductive structure 206 from exposure to plasma during plasma processing and/or exhaust gas evacuation.

Movable electrically conductive structure 206 is implemented in the example of FIG. 2 by a cylindrical-shaped anodized aluminum sleeve that backs cylindrical-shaped quartz ring 204a. Although anodized aluminum is employed, any suitable conductive material may also be employed. Movable electrically conductive structure 206 provides a low impedance path for RF current that traverses the thin material of cylindrical-shaped quartz ring 204a. One or more flexible conductive straps 212 couple movable electrically conductive structure 206 to a grounded chamber component, such as the chamber top plate as shown in the example of FIG. 2 or to some other grounded chamber component. In an embodiment, multiple conductive straps may be disposed around the circumference of the cylindrical-shaped anodized aluminum sleeve to provide multiple paths to ground and cylindrical symmetry for the returning RF current. As mentioned, it is desirable in some cases to provide a thermal expansion gap between movable plasma-facing structure 204 and movable electrically conductive structure 206.

To facilitate substrate insertion and removal into the chamber, movable plasma confinement structure 202 (including both movable plasma-facing structure 204 and movable electrically conductive structure 206) may be moved up and down as needed. The specific mechanism employed for achieving the linear translation in the up/down direction may be any type of transducer and/or gearing, including electro-mechanical, air-actuated, etc., which has been described in prior art. Flexible conductive strap 212 flexes to accommodate the movement of movable plasma confinement structure 202 while maintaining the desired low impedance path to ground.

During plasma processing, movable plasma confinement structure 202 is lowered into a deployed position as shown in FIG. 2. Exhaust gas may be evacuated through gap 214 that exists under movable plasma confinement structure 202. The dimension of gap 214 may be dimensioned to permit exhaust gas evacuation while presenting a barrier to plasma expansion to prevent the occurrence of a plasma unconfinement event in the annular outer region 220 outside of plasma confinement region 222. If desired, additional slots or holes may be formed through movable plasma confinement structure 202 and movable electrically conductive structure 206 to increase exhaust gas conductance. One such slot is shown as slot 230 in the example of FIG. 2. Slots may be oriented vertically as well as horizontally or both. Additionally, slots may be placed in the annular ground 232 to provide additional exhaust gas conductance while maintaining plasma confinement, as described in prior art.

Since there is a low impedance RF current path to ground, the plasma sheath voltage that is developed at the surface of plasma-facing structure 204 will be higher than in the case of FIG. 1, where the confinement rings are electrically floating. The higher plasma sheath voltage results in a higher ion bombardment energy, which reduces residue accumulation on plasma-facing structure 204 during processing and increases residue removal during plasma cleaning processes. Furthermore, the higher ion energy bombardment also heats up the plasma-facing surfaces of movable plasma confinement structure 202, further contributing to a reduction of residue accumulation during processing and an increase in residue removal during plasma cleaning processes.

The presence of electrically conductive structure 206 also helps reduce the occurrence of unwanted unconfinement plasma events in annular outer region 220. With reference back to FIG. 1, since quartz confinement rings 110 are electrically floating, a capacitive field is set up with field lines emanating from the plasma and terminating at grounded chamber surfaces 138 outside of confinement rings 110. These field lines are shown as field lines 140a-d, for example. The presence of a capacitive field in the annular outer region 142 outside of plasma confinement region 144 increases the possibility that plasma may be inadvertently ignited and/or sustained in this annular outer region 142, i.e., an unconfined plasma event.

In the embodiment of FIG. 2, however, most capacitive field lines emanating from the plasma terminate at movable electrically conductive structure 206 (shown by field lines 214a-c). Although some field lines may traverse movable plasma-facing structure 204 and gap 214 under movable plasma confinement structure 202 to terminate at other grounded components, the fact that field lines 214a-c no longer traverse annular outer region 220 substantially reduces and/or eliminates the presence of a capacitive field in annular outer region 220. By substantially reducing and/or eliminating the presence of a capacitive field in annular outer region 220, it is less likely that unconfined plasma may be formed and/or sustained in annular outer region 220.

Figure 3:
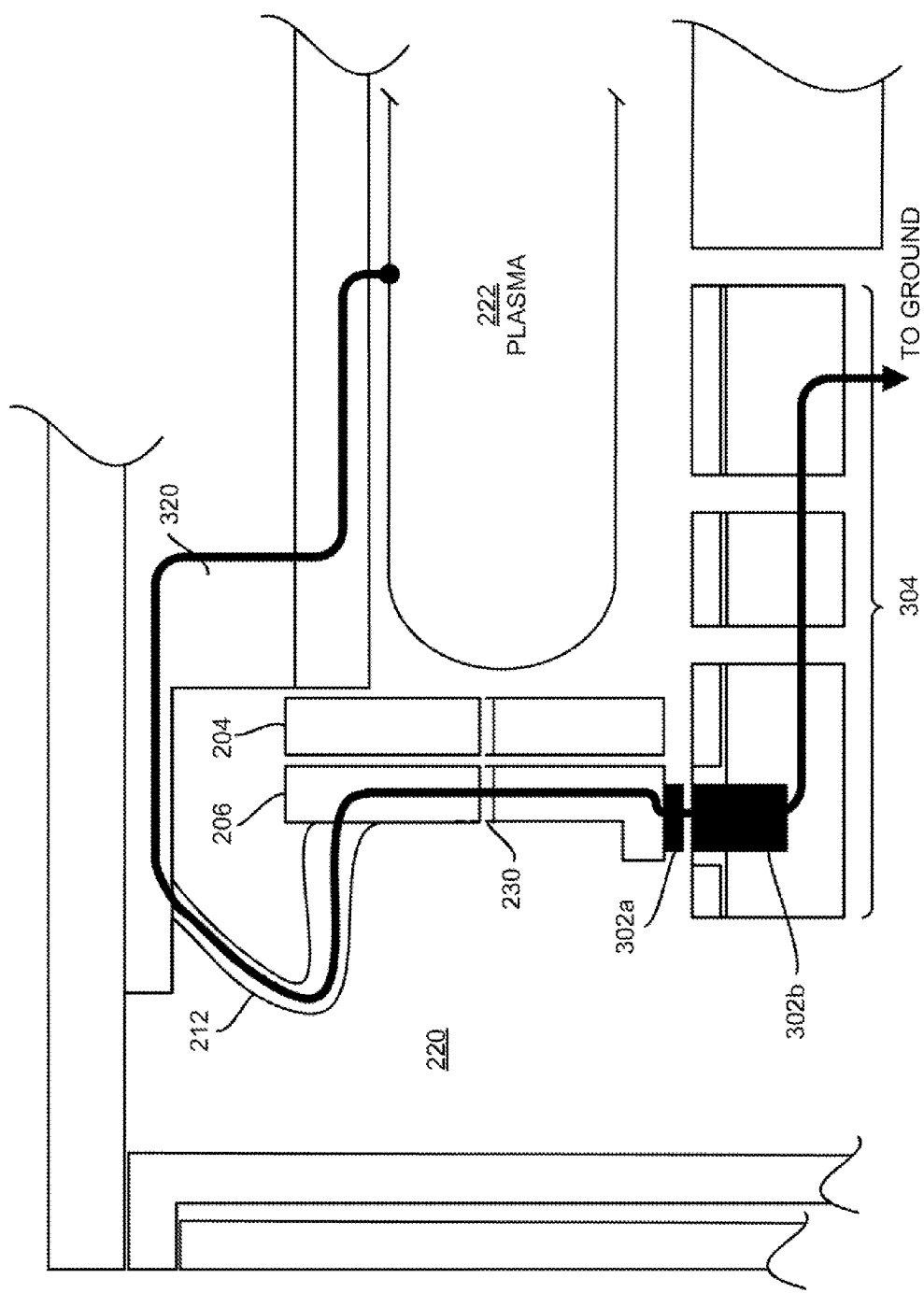
FIG. 3 shows, in accordance with an embodiment of the present invention, an alternative or additional embodiment that includes an optional bottom RF contact for shortening the RF current path to ground.

FIG. 3 shows, in accordance with an embodiment of the present invention, an alternative or additional embodiment that includes an optional bottom RF contact for shortening the RF current path to ground and thus reducing the ground-current inductive field in annular outer region 220 to further reduce the possibility of unconfined plasma formation. Referring back to FIG. 1, RF current from the plasma follows along the low impedance path shown by arrow 150. This RF current flows along chamber walls that are adjacent to annular outer region 142 and sets up an inductive field that encourages the formation of unconfinement plasma in annular outer region 142.

In FIG. 3, a breakable RF contact 302a is provided at the bottom of movable electrically conductive structure 206. There is another corresponding breakable RF contact 302b coupled to RF ground. To ensure a good RF contact, a spring or other resilient mechanism may be employed to urge the two RF contacts 302a and 302b together when the movable plasma confinement structure is deployed and RF connectivity is desired. In an embodiment, one or each of RF contacts 302a and 302b may be mounted at least partially in a hole or depression, with the spring or resilient mechanism disposed under the RF contact at the bottom of such depression or hole to urge the RF contacts toward its counterpart to ensure good RF connectivity when the movable plasma confinement structure, including movable electrically conductive structure 206, is in a deployed position. For illustration clarity, the movable plasma confinement structure is shown only in a partially deployed position in FIG. 3, with the RF contacts not yet in physical contact with one another.

In the example of FIG. 3, corresponding breakable RF contact 302b is coupled to the conductive material of annular grounded electrode 304. In an embodiment, SiC is employed for the breakable RF contacts although any other electrically conductive material that is both compatible with the plasma process and sufficiently durable to withstand repeated contact making-and-breaking may also be employed.

During plasma processing, the movable plasma confinement structure is deployed in the down or deployed position, and breakable RF contacts 302a and 302b are urged together to permit RF current to flow in the direction of arrow 320 at the surface facing plasma region 222. Note that the RF current in FIG. 3 traverses movable electrically conductive structure 206 and RF contacts 302a/302b on the way to RF ground. This is in contrast to the situation in FIG. 1, where the RF current flows along the chamber surfaces that are adjacent to outer annular region 142 (see arrow 150 in FIG. 1). Since RF current does not flow along the chamber surfaces that are adjacent to outer annular region 220, but rather at the inner, plasma facing surface of conductive structure 206, no inductive field is set up in this outer annular region 220 to promote the formation or sustaining of unwanted unconfinement plasma.

As can be appreciated from the foregoing, embodiments of the invention contribute to reduced residue formation on the plasma confinement structure surfaces during processing and also contribute to improved residue removal during in-situ plasma clean processes. The presence of the movable electrically conductive structure for terminating capacitive field lines emanating from the plasma also renders it less likely that unwanted unconfinement plasma would be ignited and/or sustained in the outer annular region by a capacitive field. If a breakable RF contact is provided as discussed, the shorter RF current path to ground that bypasses the chamber wall surfaces adjacent to the outer annular region also substantially reduces and/or eliminates the possibility that unwanted unconfinement plasma would be ignited and/or sustained by an inductive field in the outer annular region. These improvements help improve wafer throughput and process control, leading to a lower cost of ownership and improved yield.

While this invention has been described in terms of several embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention. Furthermore, embodiments of the present invention may find utility in other applications.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. It should also be noted that there are many alternative ways of implementing the methods and apparatuses of the present invention. If the term "set" is employed herein, such term is intended to have its commonly understood mathematical meaning to cover zero, one, or more than one member. It may be therefore intended that the following appended claims be interpreted as including all such alternations, permutations, and equivalents as fall within the true spirit and scope of the present invention.

What is claimed is:

1. A method for manufacturing a plasma processing system with a plasma processing chamber, comprising:
   providing a movable plasma-facing structure configured to surround a plasma, wherein said plasma is generated during plasma processing of a substrate within said plasma processing chamber;
   disposing a movable electrically conductive structure outside of said movable plasma-facing structure, wherein said movable electrically conductive structure is configured to be deployed and retracted with said movable plasma-facing structure as a single unit to facilitate handling of said substrate, said movable electrically conductive structure being radio frequency (RF) grounded during said plasma processing, wherein said movable plasma-facing structure is disposed between said plasma and said movable electrically conductive structure during said plasma processing such that RF current from said plasma flows to said movable electrically conductive structure through said movable plasma-facing structure during said plasma processing; and
   coupling a set of conductive straps to said movable electrically conductive structure, wherein said set of conductive straps accommodates said movable electrically conductive structure when said movable electrically conductive structure is deployed and retracted while providing said RF current a low impedance path to ground.

2. The method of claim 1 further including disposing a breakable RF contact between said movable electrically conductive structure and said ground such that said low impedance path to said ground is formed through said breakable RF contact when said movable electrically conductive structure is deployed.

3. The method of claim 2 further including forming at least one slot in both said movable plasma-facing structure and said movable electrically conductive structure to facilitate removal of exhaust gas during said plasma processing.

4. The method of claim 1 further including disposing said set of conductive straps around the circumference of said movable electrically conductive structure to provide multiple low impedance paths to said ground.

5. The method of claim 1 wherein said movable plasma-facing structure being a cylindrical-shaped structure and being formed of a material that is resistant to etching by said plasma.

6. The method of claim 1 wherein said movable plasma-facing structure being formed of quartz.

7. The method of claim 1 wherein said movable plasma-facing structure being formed of doped-SiC.

8. The method of claim 1 further including employing said movable plasma-facing structure to shield said movable electrically conductive structure from exposure to said plasma during said plasma processing.

9. The method of claim 1 wherein said movable electrically conductive structure being separated from said movable plasma facing structure by a gap to accommodate thermal expansion.

10. The method of claim 1 wherein said movable plasma-facing structure being a cylindrical-shaped structure and said at least one slot is disposed along an axis of said cylindrical-shaped structure.

11. The method of claim 1 wherein at least one flexible conductive strap of said set of conductive straps is coupled to said movable electrically conductive structure.

12. A method for manufacturing a plasma processing system with a plasma processing chamber, comprising:
    providing a movable plasma confinement structure configured for confining a plasma in said plasma processing chamber during plasma processing of a substrate, said plasma processing chamber having a plasma region wherein plasma is generated, said plasma region disposed above a lower electrode and between an upper electrode and said lower electrode;
    providing a cylindrical-shaped movable plasma-facing structure configured to surround said plasma region that is disposed above said lower electrode and between said upper electrode and said lower electrode to confine a plasma in said plasma region;
    disposing a cylindrical-shaped movable electrically conductive structure outside of said cylindrical-shaped movable plasma-facing structure, wherein both said cylindrical-shaped movable plasma-facing structure and said cylindrical-shaped movable electrically conductive structure are retractable in a direction parallel to a cylindrical axis of said plasma processing chamber, wherein said cylindrical-shaped movable plasma-facing structure is disposed between said plasma and said cylindrical-shaped movable electrically conductive structure during said plasma processing such that at least a portion of RF current from said plasma flows to said cylindrical-shaped movable electrically conductive structure through said cylindrical-shaped movable plasma-facing structure during said plasma processing; and
    coupling a set of conductive structures to said cylindrical-shaped movable electrically conductive structure, said cylindrical-shaped movable electrically conductive structure conducting said at least a portion of RF current to ground during said plasma processing.

13. The method of claim 12 further including employing said cylindrical-shaped movable plasma-facing structure to shield said cylindrical-shaped movable electrically conductive structure from exposure to said plasma during said plasma processing.

14. The method of claim 12 wherein said cylindrical-shaped movable electrically conductive structure backs said cylindrical-shaped movable plasma-facing structure.

15. The method of claim 12 further including coupling said cylindrical-shaped movable electrically conductive structure to said cylindrical-shaped movable plasma-facing structure through a thermal expansion gap.

16. The method of claim 12 further including disposing a breakable RF contact between said cylindrical-shaped movable electrically conductive structure and ground such that a low impedance path to said ground is formed through said breakable RF contact when said cylindrical-shaped movable electrically conductive structure is deployed.

17. The method of claim 12 further including forming a first aperture in said cylindrical-shaped movable plasma-facing structure and a second aperture in said cylindrical-shaped movable electrically conductive structure to facilitate removal of exhaust gas during said plasma processing.

18. The method of claim 12 further including disposing said set of conductive straps around the circumference of said cylindrical-shaped movable electrically conductive structure to provide multiple low impedance paths to said ground.

19. The method of claim 12 wherein said cylindrical-shaped movable electrically conductive structure includes at least one flexible conductive strap.

20. The method of claim 12 further including forming at least one breakable RF contact, wherein said breakable RF contact completing an RF current path from said cylindrical-shaped movable electrically conductive structure to ground when said cylindrical-shaped movable electrically conductive structure is deployed, said breakable RF contact breaks said RF current path from said cylindrical-shaped movable electrically conductive structure to said ground when said cylindrical-shaped movable electrically conductive structure is retracted.

* * * * *